United States Patent [19]

Kanamaru et al.

[11] 4,315,116

[45] Feb. 9, 1982

[54] SWITCH ASSEMBLY WITH LEAKAGE CURRENT DETECTING MEANS

[75] Inventors: Koichi Kanamaru, Akigawa; Misao Takeuchi, Tachikawa, both of Japan

[73] Assignee: Nissan Motor Company, Limited, Yokohama, Japan

[21] Appl. No.: 46,607

[22] Filed: Jun. 8, 1979

[30] Foreign Application Priority Data

Jun. 23, 1978 [JP] Japan .................................. 53-75441

[51] Int. Cl.³ .............................................. H01H 3/16
[52] U.S. Cl. .................................................. 200/61.09
[58] Field of Search .................. 200/61.09, 61.2, 61.21

[56] References Cited

U.S. PATENT DOCUMENTS 3,293,390 12/1966 Shaw .............................. 200/61.2 X
3,432,750 3/1969 Botstiber ...................... 200/61.09 X

FOREIGN PATENT DOCUMENTS 44464 11/1956 Fed. Rep. of Germany .
1827467 1/1961 Fed. Rep. of Germany .

OTHER PUBLICATIONS

Electrical Engineering Journal, vol. 29, Book 4, pp. 125–128; 1977.

*Primary Examiner*—James R. Scott

[57] ABSTRACT

A movable-contact switch assembly wherein an electrically conductive leakage detecting element connected to an indicator lamp is located in the vicinity of the stationary contact elements of the switch assembly so as to detect the presence of a conductive path or paths formed between any two or more of the stationary contact elements by the deposits of carbon particles on and around the contact elements.

8 Claims, 12 Drawing Figures

SWITCH ASSEMBLY WITH LEAKAGE CURRENT DETECTING MEANS

FIELD OF THE INVENTION

The present invention relates in general to electric switches and, particularly, to electric switch devices of the movable contact type. More particularly, the present invention is concerned with a movable-contact switch assembly having leakage detecting means to detect and visually display leakage of current in the switch assembly.

BACKGROUND OF THE INVENTION

Electric switch devices of the movable contact type are, in most cases, used in exacting conditions because such switch devices employ elements which are mechanically movable and which are accordingly subject to wear, abrasion or impact resulting from the sliding or striking motions of the movable elements. In the case of limit switches which are broadly used for the automatic control of various types of power-driven machines or equipment such as machine tools and industrial machinery for example, the movable or slidable elements incorporated in a switch device include not only the movable electric contacts but some slidable members of the switch housing and the elements mechanically connecting the slidable members to the movable contacts so that the switch assembly is subjected to more exacting conditions during use thereof because the sliding movement of the members are usually accompanied by generation of heat resulting from the friction between the slidable members. If, furthermore, a movable-contact switch device is of the oil-filled type having the contact elements enclosed within a sealed contact casing immersed in oil, repeated attacks of heat and mechanical impact to the switch device cause early deterioration of the sealing elements provided between the contact casing of the switch device and some of the slidable members forming part of the switch housing. When the sealing elements or some of the sealing elements thus isolating the contact elements from the oil in the switch housing are thus destroyed or otherwise damaged, the sealing elements fail to function properly and will permit entry of oil past the sealing elements into the interior of the contact casing from the oil chamber in the switch housing. The oil admitted into the contact casing tends to be burned and carbonized by the sparks which are produced between the movable and stationary contact elements within the contact casing when the contact elements are brought into or out of contact with each other. The fine particles of carbon thus produced around each of the contact elements deposit on each contact element. As the accumulation of the carbon particles in the contact casing proceeds, the deposits of the carbon particles on the stationary contact elements form an electrically conductive path between the individual stationary contact elements and destroy or at least impair the function of the switch device. If the switch device thus disabled is one of a number of similar switch units which are in operation concurrently, efforts for trouble shooting must be made for one after another of the individual switch devices until the particular switch device in trouble is found out. If it is desired to further inspect the switch device for the degree to which the contact elements are contaminated with carbon, the switch device must be wholly disassembled to measure the electrical resistance between the individual stationary contact elements of the switch device. Disproportionate amounts of time and labor are required of the efforts which must be paid for these purposes. The present invention contemplates elimination of these drawbacks which have thus far been encountered in conventional electric switch devices of the movable-contact type.

SUMMARY OF THE INVENTION

It is, accordingly, an object of the present invention to provide a movable-contact switch assembly having leakage current detecting means adapted to automatically detect and visually display leakage of current in the switch assembly.

In accordance with the present invention, such an object of the invention is accomplished basically in a movable-contact switch assembly comprising, in combination, movable and stationary contact elements including at least one set of stationary contact elements, an electrically conductive leakage detecting element located in the vicinity of the set of stationary contact elements, and a leakage indicating device which is electrically connected to the leakage detecting element. The conductive leakage detecting element is preferably located at substantially equal distances from the individual stationary contact elements. The switch assembly may further comprise a switch-on indicating device which is connected across the above mentioned set of stationary contact elements.

DESCRIPTION OF THE DRAWINGS

The drawbacks which have been hereinbefore encountered in prior-art movable-contact switch devices and the features and advantages of a switch assembly according to the present invention will be described in more detail in the following description taken in conjunction with the accompanying drawings, in which like reference numerals designate similar or corresponding structures, members and elements throughout the figures and in which.

DETAILED DESCRIPTION OF THE PRIOR ART

Figure 1:
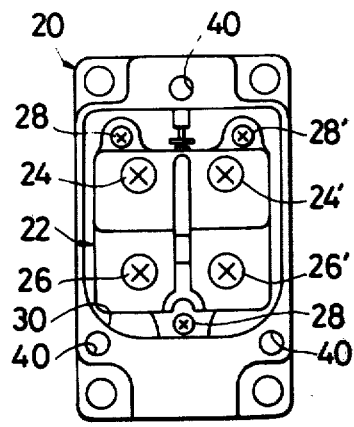
FIG. 1 is a front elevation view of a prior-art limit switch assembly with its front cover structure disassembled from the housing structure of the switch assembly.

Referring to FIGS. 1 to 4 of the drawings, first particularly to FIG. 1, a known limit switch assembly used in a control circuit for a machine tool is shown comprising a hollow housing structure 20 having enclosed therein a contact casing 22 having two pairs of terminal elements 24, 24', 26 and 26' projecting from the casing 22. Each of the terminal elements 24, 24', 26 and 26' is usually constituted by an electrically conductive screw. The contact casing 22 is fixedly attached to an interior wall of the housing structure 20 by suitable fastening means such as screws commonly designated by reference numeral 28 as shown. Though not illustrated in FIG. 1, the contact casing 22 has incorporated therein a switch unit consisting of a suitable number of stationary contact elements and at least one movable contact element which is mechanically connected to or engaged by a suitable actuating mechanism enclosed within the housing structure 20 and operatively coupled to any movable member or structure of the machine tool to be controlled by the limit switch assembly.

Figure 2:
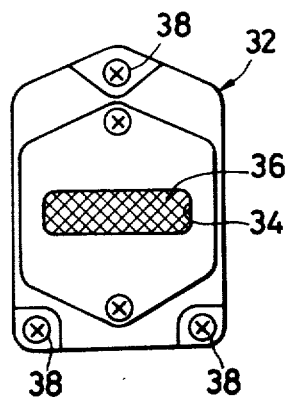
FIG. 2 is a front elevation view of the front cover structure to be attached to the housing structure of the limit switch assembly illustrated in FIG. 1.
Figure 3:
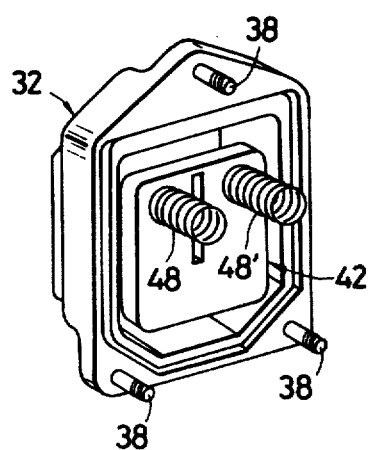
FIG. 3 is a perspective view showing the interior arrangement of the front cover structure illustrated in FIG. 2.

The housing structure 20 has an opening 30 at its front end for providing access to the contact casing 22 thus arranged within the housing structure 22. The opening 30 is closed by a front cover structure 32 illustrated in FIGS. 2 and 3. As shown in FIG. 2, the front cover structure 32 is formed with a light display window 34 which is open at the front end of the cover structure 32 and which is screened with a protective wire mesh 36. The front cover structure 32 is usually constructed of a casting of a cast-iron of a suitable metal alloy and is detachably attached to the housing structure 20 shown in FIG. 1 by suitable fastening means such as screws 38 respectively fitted into holes 40 formed in front wall portions of the housing structure 20. As illustrated in FIG. 3, the front cover structure 32 thus constructed generally has fixedly mounted therewithin a lamp holder 42 by suitable fastening means (not shown).

Figure 4:
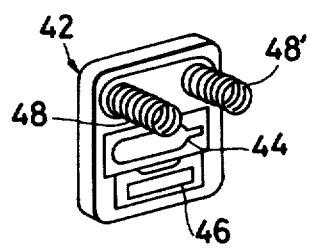
FIG. 4 is a perspective view schematically showing the general construction of a lamp holder enclosed within the front cover structure shown in FIGS. 2 and 3.

As shown schematically in FIG. 4, the lamp holder 42 has securely but detachably fitted therein a suitable electric lamp such as an elongated neon lamp 44 and an electric resistance element 46 for protecting the neon lamp 44 from overcurrent. The neon lamp 44 is positioned at the rear of and extends in parallel with the above described light display window 34 (FIG. 2) in the front cover structure 32. The neon lamp 44 has two electrodes (not shown) which are electrically connected by suitable conductive means to the terminal elements 24 and 24', respectively, of the switch unit enclosed within the contact casing 22. Such conductive means is shown in FIGS. 3 and 4 as comprising two electrically conductive springs 48 and 48' which are positioned under compression between the lamp holder 42 and the contact casing 22 (FIG. 1). The springs 48 and 48' are seated each at one end on the terminal elements 24 and 24', respectively, and at the other ends thereof on the lamp holder 42 for connection to the electrodes of the neon lamp 44 through the protective resistance element 46 and suitable lead wires (not shown) forming part of the above mentioned conductive means.

Figure 5:
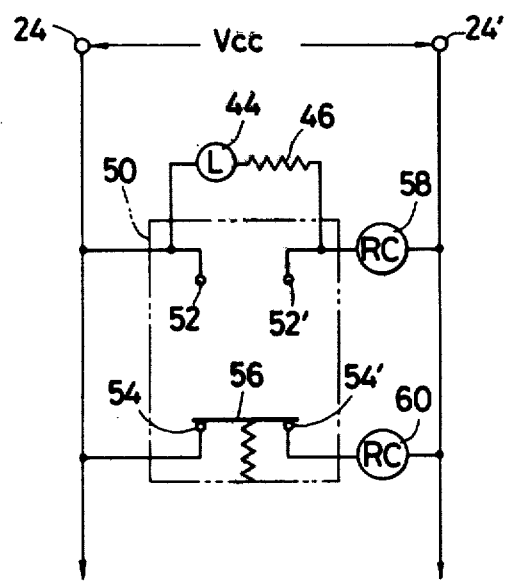
FIG. 5 is a circuit diagram showing an equivalent electric circuit constituted by the contact elements and a switch-on indicating device incorporated in the limit switch assembly illustrated in FIGS. 1 to 4.
Figure 6:
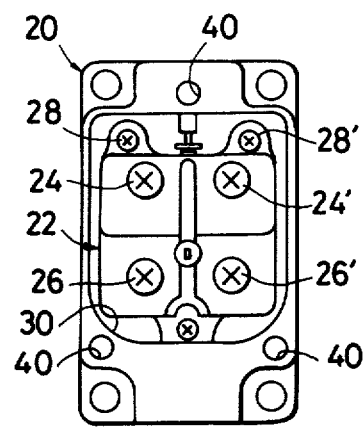
FIG. 6 is a front elevation view showing a preferred embodiment of a movable-contact switch assembly according to the present invention with its front cover structure detached removed from the housing structure of the switch assembly.

In FIG. 5, the switch unit incorporated in the switch casing 22 shown in FIG. 1 is schematically represented in its entirety by reference numeral 50 and is shown by way of example as comprising two sets of normally-open stationary contact elements 52 and 52' and a second pair of stationary contact elements 54 and 54'. A spring-loaded movable contact element 56 is movable between the first and second pairs of stationary contact elements. Though not shown in the drawings, the movable contact element 56 is mechanically connected to or engaged by a suitable actuating mechanism operatively coupled to any movable member or structure forming part of the machine tool to be controlled by the switch assembly. The electrodes of the neon lamp 44 and the protective resistance element 46 therefor are electrically connected in series between the two terminal elements 24 and 24' on the contact casing 22 shown in FIG. 1. The terminals 24 and 24' are connected across a suitable source (not shown) of a constant voltage when the machine tool is in operation. The first pair of stationary contact elements 52 and 52' and the second pair of stationary contact elements 54 and 54' are arranged in parallel with each other across the series combination of the electrodes of the neon lamp 44 and the resistance element 46. The electrodes of the neon lamp 46 is, thus, connected to the power source through the protective resistance element 46 and one of the first pair of stationary contact elements 52 and 52' and the second pair of stationary contact elements 54 and 54' when the movable contact element 56 is in contact with the stationary contact elements 52 and 52' or 54 and 54'. The electrodes of the neon lamp 44 and the protective resistance element 46 are connected across the first and second pairs of stationary contact elements through suitable resistance-capacitance circuits 58 and 60, respectively, having different time constants.

When, in operation, the movable contact element 56 is in contact with one of the first and second pairs of stationary contact elements such as, for example, the second pair of stationary contact elements 54 and 54' as shown in FIG. 5, the electrodes of the neon lamp 44 are connected to the power source through the second pair of stationary contact elements 54 and 54' and the movable contact element 56 if the first pair of stationary contact elements 52 and 52' are electrically isolated from each other and from the second pair of stationary contact elements 54 and 54'. The electrodes of the neon lamp 44 are now energized from the power source through the protective resistance element 46 and the resistance-capacitance circuit 60 so that the neon lamp 44 is properly turned on and, by the light radiating out from the lamp through the screened light display window 34, enables the operator of the machine tool to make certain that the switch assembly is properly operative. If, however, fine particles of carbon have collected on the contact elements 52, 52', 54 and 54' or on some of these contact elements for the reasons previously discussed, the deposits of the carbon particles form a conductive path between any two of the contact elements or conductive paths among the three or four contact elements. When this occurs, the electrodes of the neon lamp 44 are constantly connected to the power source through the contact elements thus bridged or are constantly shunted by the bridged contact elements so that the neon lamp 44 is overloaded to burn or otherwise damage or can not be energized by the rated voltage so as to fail to glow properly. If the switch assembly under discussion is one of a number of similar switch units which are in operation concurrently, disproportionate amounts of time and labor are required for the trouble shooting and servicing of the switch units as previously pointed out.

DESCRIPTION OF A PREFERRED EMBODIMENT

The present invention aims at resolution of such a problem encountered in a movable-contact switch device of the type hereinbefore described. FIGS. 6 to 11 show a preferred embodiment of a switch assembly adapted to accomplish such an object of the present invention. In FIGS. 6 to 11, the movable-contact switch assembly according to the present invention is shown, by way of example, to be embodied in a switch assembly of the limit switch type similar in basic construction to the prior-art limit switch assembly hereinbefore described with reference to FIGS. 1 to 5. Among the structures, members and elements included in the switch assembly illustrated in FIGS. 6 to 11, those having their respective counterparts in the prior-art limit switch assembly of FIGS. 1 to 5 are designated by the same reference numerals as those indicating such counterparts with primes applied thereto where necessary.

Figure 7:
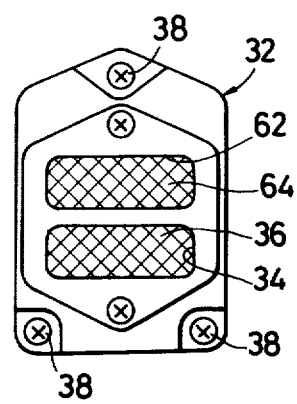
FIG. 7 is a front elevation view of the front cover structure to be attached to the housing structure of the switch assembly illustrated in FIG. 6.
Figure 8:
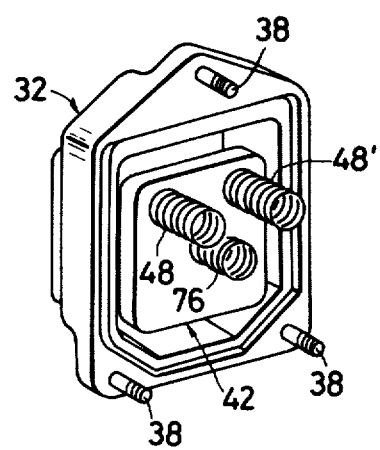
FIG. 8 is a perspective view showing the interior arrangement of the front cover structure illustrated in FIG. 7.
Figure 9:
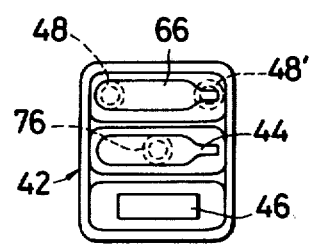
FIG. 9 is a plan view schematically showing the general construction of a lamp holder enclosed within the front cover structure illustrated in FIGS. 7 and 8.
Figure 10:
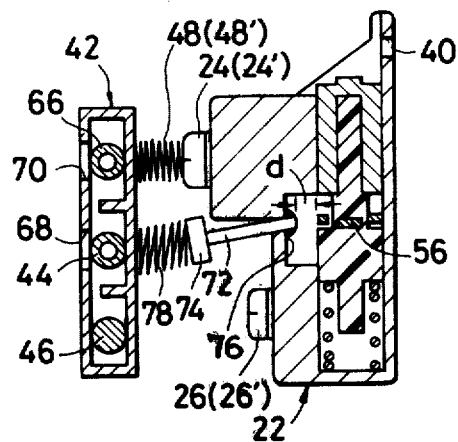
FIG. 10 is a sectional view, in a fore-and-aft direction, of the embodiment of the switch assembly according to the present invention, wherein the enclosure having the lamp holder accommodated therewithin is omitted for simplicity of illustration.
Figure 11:
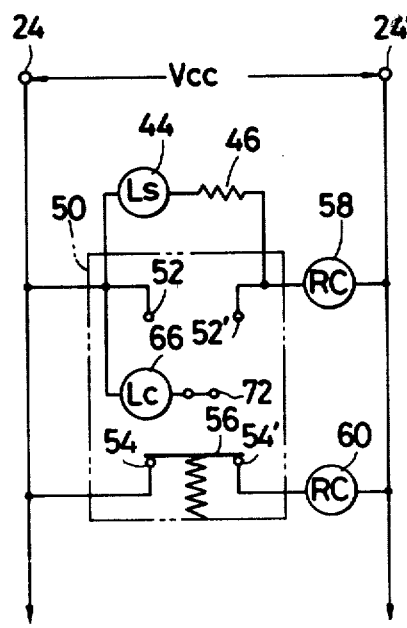
FIG. 11 is a circuit diagram showing an equivalent electric circuit constituted by the contact elements and switch-on and leakage indicating devices incorporated in the switch assembly illustrated in FIGS. 6 to 10.

As shown in FIG. 7, the front cover structure 32 of the switch assembly embodying the present invention has, in addition to the main or first light display window 34 having its counterpart in the prior-art switch assembly of FIGS. 1 to 5, an auxiliary or second light display window 62 extending above and substantially in parallel with the main light display window 34. Similarly to the main light display window 34, the auxiliary light display window 62 is screened with a sheet of wire mesh 64 for protective purposes. Furthermore, the lamp holder 42 forming part of the switch assembly embodying the present invention has spaced parallel front and rear walls as shown in FIG. 10 and has detachably provided between these walls a first or switch-in indicating neon lamp arranged similarly to the neon lamp 44 incorporated in the prior-art switch assembly of FIGS. 1 to 5 and a second or leakage detecting neon lamp 66 which is positioned above and substantially in parallel with the switch-in indicating neon lamp 44 as shown in FIGS. 9 and 10. The protective resistance element 46 for the switch-in indicating lamp 44 is also housed within the lamp holder 42 and is positioned below the switch-in indicating neon lamp 44. The lamp holder 42 has formed in its front wall two laterally elongated slots 68 and 70 which are open in front of the switch-in and leakage indicating neon lamps 44 and 66, respectively, within the lamp holder 42 as shown in FIG. 10. Though not shown in the drawings, these slots 68 and 70 in the front wall of the lamp cover 42 are open at the rear of the main and auxiliary light display windows 34 and 62 in the front cover structure 32 within which the lamp holder 42 is fixedly positoned in front of the terminal elements 24, 24', 26 and 26' on the contact casing 22 within the housing structure 20 shown in FIG. 1. The electrically conductive, preloaded helical compression springs 48 and 48' providing electrical connection between the switch-in indicating neon lamp 34 and the terminal elements 24 and 24' on the contact casing 22 are positioned under compression between the contact casing 22 and the lamp holder 42 and are seated each at one end on the lamp holder 42 and at the other ends thereof on the terminal elements 24 and 24' projecting from the contact casing 22 as will be best seen from FIG. 10.

The switch assembly embodying the present invention further comprises an elongated, electrically conductive leakage detecting element 72 having an annular flange 74 on its intermediate axial portion as shown in FIG. 10. The leakage detecting element 72 axially projects into the contact casing 22 and has its inner axial end portion located at substantially equal spacings d from the individual stationary contact elements provided within the contact casing 22, the stationary contact elements being represented by the contact element 52 in FIG. 10. The spacing d between the inner axial end of the leakage detecting element 72 and each of the stationary contact elements in the contact casing 22 is preferably within the range of between 0.5 mm and 1.0 mm although such a spacing may vary depending upon the sizes of the stationary contact elements and the spacings between the contact elements. The leakage detecting element 72 is welded as at 76 to an interior wall portion of the contact casing 22 or otherwise suitably secured to the contact casing 22 and axially projects forwardly from the contact casing 22 toward the rear wall of the lamp holder 42 which is positioned in front of the contact casing 22. The leakage detecting element 72 is electrically connected to the leakage indicating neon lamp 66 by suitable conductive means including, by way of example, an electrically conductive, preloaded helical compression spring 78 which is seated at one end on the rear face of the lamp holder 42 and at the other end thereof on the front end face of the flange 74 of the detecting element 72 as shown in FIG. 10. The leakage detecting element 72 is preferably constructed by a bar plated with a suitable corrosion-resistive, electrically conductive metal such as for example brass or a silver alloy.

Figure 12:
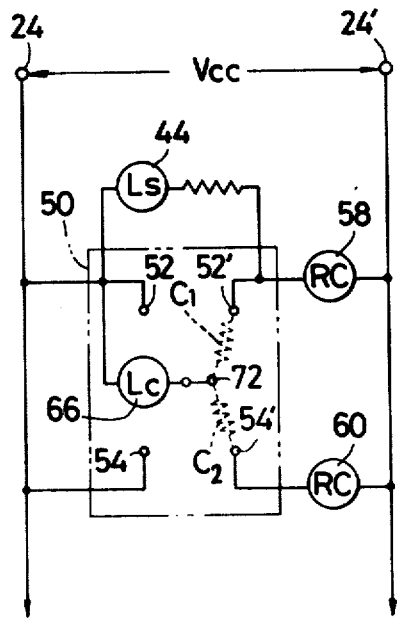
FIG. 12 is a circuit diagram similar to FIG. 11 but shows an equivalent electric circuit formed when short circuits are produced among the stationary contact elements incorporated in the switch assembly illustrated in FIGS. 6 to 11.

When, now, the switch unit made up of the stationary contact elements 52, 52', 54 and 54' and the movable contact element 56 in the switch assembly thus constructed and arranged in accordance with the present invention is properly operative in the absence of conductive paths formed by particles of carbon among the stationary contact elements 52, 52', 54 and 54', the leakage detecting element 72 is electrically isolated from all of these contact elements so that the leakage indicating neon lamp 66 connected between the power source and the leakage detecting element 72 is maintained inoperative. Only the switch-in indicating lamp 44 is thus energized and glows when the movable contact element 56 is actuated to be separated from the first pair of stationary contact elements 52 and 52'. Practically in this condition, as will be seen from FIG. 11, the movable contact element 56 rests on the second pair of stationary contact elements 54 and 54'. If, however, fine particles of carbon are accumulated on the stationary contact elements 52', and 54' and further between the inner end of the leakage detecting element 72 and these contact elements, conductive paths are formed between the leakage detecting element 72 and the individual contact elements 52', 54 and 54' as indicated by $C_1$ and $C_2$ respectively, in FIG. 12. Electrical connection is now established between the leakage indicating neon lamp 66 and the power source through one of these conductive paths $C_1$ and $C_2$ and the conductive spring 78 (FIG. 10) providing electrical connection between the leakage detecting element 72 and the neon lamp 66. Not only the switch-in indicating neon lamp 44 but also the leakage indicating neon lamp 66 is therefore maintained energized from the power source and enables the operator of the machine tool to know the occurrence of the leakage of current in the switch assembly by the light viewed through the auxiliary light display window 62 in the front cover structure 32 (FIG. 7).

The switch assembly according to the present invention being thus constructed and operative, advantages are achieved over prior-art movable-contact switch devices as follows:

(1) An occurrence of leakage of current in the switch assembly can be readily detected by visual inspection of the switch assembly without having recourse to inspection and trouble shooting of any of the mechanical and electrical devices cooperating with the switch assembly.

(2) The occurrence of the leakage of current being detected simply by visual inspection of the switch assembly, the time-consuming efforts which have been indispensable for the detection of the switch unit in trouble out of a number of switch units and for the disassembly and the mesurement of resistances of the switch unit thus found out to be in trouble can be dispensed with.

(3) The downtime required for the inspection, trouble shooting and servicing of the equipment due to a failure of the switch device attached to the equipment can be reduced considerably.

(4) The leakage detecting and indicating means being simple in construction, the switch assembly incorporating such means has a compact and small-sized overall construction which can be manufactured at a low cost.

While only one preferred embodiment of the present invention has been hereinbefore described and shown, it should be borne in mind that such an embodiment is merely illustrative of the scope of the present invention, and, as such, may be changed or modified in numerous manners if desired. For example, the switch unit 50 of the embodiment herein described may be modified to include two movable contact elements which are cooperative with the first and second pairs of stationary contact elements, respectively. Furthermore, the switch unit 50 which has been described to comprise two sets of stationary contact elements may be replaced with a switch unit comprising only one set of stationary contact elements or more than two sets of stationary contact elements arranged in parallel. Each of the switch-in indicating lamp 44 and the leakage indicating lamp 66 may be substituted by any other type of gaseous-discharge lamps or by an incandescent filament lamp. While, furthermore, the present invention has been described to be embodied in a switch assembly of the limit switch type, it is apparent that the subject matter of the present invention is applicable to any other type of movable-contact switch assembly using at least one movable contact element and at least one set of stationary contact elements. If desired, the leakage indicating neon lamp or any equivalent thereof may be electrically connected in series with a suitable sound-producing warning device such as a buzzer.

What is claimed is:

1. A system comprising, in combination:
   a switch device including first and second spaced stationary contacts between which a predetermined electric potential may be applied, and a movable contact which is contactable with said first and second stationary contacts to complete electrical connection therebetween, the long term operation of said switch device showing a tendency to produce or gather electrically conductive substances around said first and second stationary contacts; and
   a leakge indicating system including a terminal member located at a relatively short but predetermined distance from said first stationary contact, and an electrically operated warning device, said terminal member being connected through said warning device to said second stationary contact, whereby when electrically conductive substances are accumulated between said terminal member and said first stationary contact to form an electrically conductive path therebetween, said warning device is energized to issue a warning.

2. A system as claimed in claim 1, in which said switch device further includes third and fourth stationary contacts which are respectively connected to said first and second stationary contacts, said movable contact being also contactable with said third and fourth stationary contacts to complete electrical connection therebetween, said terminal member being located at substantially equal distances from said first and third stationary contacts.

3. A system as claimed in claim 2, in which said switch device further comprises a switch-on indicating device which issues a warning when said movable contact is brought into contact with said third and fourth stationary contacts.

4. A system as claimed in claim 3, in which said switch-on indicating device comprises an electrically operated warning device and a resistance element which are connected in series and spanned between said first and second stationary contacts.

5. A system as claimed in claim 1, in which said terminal member is a bar plated with a corrosion-resistive metal.

6. A system as claimed in claim 5, in which said corrosion-resistive metal is selected from the group consisting of brass and a silver alloy.

7. A system as claimed in claim 1, in which said terminal member is spaced apart from said first stationary contact a distance ranging from approximately 0.5 millimeter to approximately 1.0 millimeter.

8. A system as claimed in claim 1, in which said electrically operated warning device is a neon lamp.

* * * * *